(12) United States Patent
Noguchi

(10) Patent No.: US 11,027,977 B2
(45) Date of Patent: Jun. 8, 2021

(54) METHOD OF MANUFACTURING TANTALUM CARBIDE MATERIAL

(71) Applicant: SHOWA DENKO K.K., Tokyo (JP)

(72) Inventor: Shunsuke Noguchi, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/720,476

(22) Filed: Dec. 19, 2019

(65) Prior Publication Data

US 2020/0198980 A1     Jun. 25, 2020

(30) Foreign Application Priority Data

Dec. 21, 2018 (JP) .............................. JP2018-239355

(51) Int. Cl.
*C01B 32/914* (2017.01)
*C30B 35/00* (2006.01)

(52) U.S. Cl.
CPC ............ *C01B 32/914* (2017.08); *C30B 35/00* (2013.01)

(58) Field of Classification Search
None
See application file for complete search history.

(56) References Cited

U.S. PATENT DOCUMENTS

2007/0059501 A1* 3/2007 Kaneko ................ C23C 8/20
428/209

FOREIGN PATENT DOCUMENTS

| CN | 103482625 A | * | 1/2014 |
| JP | 11-116399 A | | 4/1999 |
| JP | 2008-081362 A | | 4/2008 |
| JP | 2008-308701 A | | 12/2008 |
| JP | 2017-075075 A | | 4/2017 |

* cited by examiner

*Primary Examiner* — Guinever S Gregorio
(74) *Attorney, Agent, or Firm* — Sughrue Mion, PLLC

(57) ABSTRACT

A method of manufacturing a tantalum carbide material of the present invention includes heating a tantalum material (1) interposed between a pair of graphite guide members (2 and 3) under an atmosphere of a carbon source-containing gas (4) at 1,500° C. or higher for 0.5 hours or longer.

6 Claims, 3 Drawing Sheets

METHOD OF MANUFACTURING TANTALUM CARBIDE MATERIAL

BACKGROUND OF THE INVENTION

Field of the Invention

The present invention relates to a method of manufacturing a tantalum carbide material.

Priority is claimed on Japanese Patent Application No. 2018-239355, filed Dec. 21, 2018, the content of which is incorporated herein by reference.

Description of Related Art

Tantalum carbide is a carbide of tantalum represented by a composition formula such as TaC or $Ta_2C$, and is used as a coating material for various products and members because it has very high hardness.

In the related art, regarding a method of coating a tantalum plate, a method in which a tantalum plate is disposed on an inner wall of a graphite crucible, carbon powder is filled in so that it comes in contact with the tantalum plate, the tantalum plate is covered, the graphite crucible in this state is heated to carbonize tantalum, and thus the tantalum plate is coated with a uniform tantalum carbide has been proposed (Patent Document 1).

In addition, regarding a method of manufacturing a heat-resistant graphite member, a method in which a slurry including tantalum carbide particles is applied to the surface of a graphite substrate made of isotropic graphite, and the graphite substrate to which the slurry is applied is heated to form a tantalum carbide film formed by sintering tantalum carbide particles has been proposed (Patent Document 2).

In addition, in a device for forming a single crystal of a compound semiconductor such as SiC and GaN, a sublimation method and a high temperature CVD method (HTCVD method) for which a high temperature of 1,800° C. or higher is required are often used. In addition, regarding a carrier gas or a raw material gas, hydrogen, ammonia, or hydrocarbon gases are generally used. Therefore, when a tantalum carbide-coated carbon material is used as a member for the device for forming a single crystal described above, due to the influence of a reducing gas at a high temperature, the crystal structure of tantalum carbide constituting a tantalum carbide film and the crystallinity vary and cracks and peeling off may occur. In order to solve such a problem, a method in which a coating film including a carbon substrate and tantalum carbide formed on the carbon substrate is heated at 1,600 to 2,400° C., and thus the crystallinity of tantalum carbide in the coating film is improved has been proposed (Patent Document 3).

In addition, a method in which a surface of tantalum or a tantalum alloy and the surface of a carbon substrate on which this is superimposed on one side or both sides are placed in a vacuum heat treatment furnace, $Ta_2O_5$ formed on the surface of tantalum or a tantalum alloy is removed, and then the temperature in the vacuum heat treatment furnace is further increased, and thus the surface of tantalum or a tantalum alloy and the surface of the carbon substrate are subjected to solid phase diffusion molecular bonding has been proposed (Patent Document 4).

PATENT DOCUMENTS

[Patent Document 1] Japanese Unexamined Patent Application, First Publication No. H11-116399

[Patent Document 2] Japanese Unexamined Patent Application, First Publication No. 2017-75075

[Patent Document 3] Japanese Unexamined Patent Application, First Publication No. 2008-308701

[Patent Document 4] Japanese Unexamined Patent Application, First Publication No. 2008-81362

SUMMARY OF THE INVENTION

However, in the above technologies in Patent Documents 1 to 4, the tantalum carbide material may be deformed, and the flatness of the tantalum carbide material cannot be said to be sufficient. In addition, when the tantalum material interposed between the pair of graphite guide members is heated to obtain a tantalum carbide material, the adhesion between the tantalum film and the pair of graphite plates may vary. In this case, carbonization in a poor contact part between the tantalum material and the graphite guide member is insufficient, and uneven carbonization occurs, and as a result, the tantalum carbide is non-uniformly distributed in the tantalum carbide material. On the other hand, in order to prevent uneven carbonization, when the tantalum material is firmly interposed between the pair of graphite guide members, although uneven carbonization due to poor contact can be reduced, the tantalum carbide material may break due to the pressure.

In order to address the above problems, an object of the present invention is to provide a method of manufacturing a tantalum carbide material in which favorable flatness is realized, a tantalum carbide distribution is uniform, and cracks are unlikely to occur.

The inventors conducted extensive studies, and as a result, found that, when a tantalum material is interposed between a pair of graphite guide members serving as a carbon source and the tantalum material is heated under an atmosphere of a carbon source-containing gas including other carbon sources, favorable flatness of a tantalum carbide material is obtained, carbon contained in the carbon source-containing gas is supplied to a poor contact part between the tantalum material and the graphite guide member, sufficient carbonization occurs in that part, and accordingly, uneven carbonization is reduced, and the tantalum carbide can be uniformly distributed in the tantalum carbide material.

Specifically, main configurations of the present invention are as follows.

[1] A method of manufacturing a tantalum carbide material according to a first aspect in which a tantalum material interposed between a pair of graphite guide members is heated under a carbon source-containing gas atmosphere at 1,500° C. or higher for 0.5 hours or longer.

[2] The method of manufacturing a tantalum carbide material according to [1], may include a process of preparing the tantalum material interposed between the pair of graphite guide members; a process of placing the tantalum material interposed between the pair of graphite guide members and a hydrocarbon gas source in a container; and a process of, while the inside of the container is made a closed space, heating the hydrocarbon gas source to generate the carbon source-containing gas and heating the tantalum material under an atmosphere of the carbon source-containing gas to obtain a tantalum carbide material.

[3] The method of manufacturing a tantalum carbide material according to [2], wherein the hydrocarbon gas source may include hydrocarbons, and wherein the hydrocarbons may include one or both of aromatic hydrocarbons and aliphatic hydrocarbons.

[4] The method of manufacturing a tantalum carbide material according to any one of [1] to [3], wherein the thickness of the tantalum material may be 0.1 mm or more and 3.0 mm or less.

[5] The method of manufacturing a tantalum carbide material according to any one of [1] to [4], wherein the pair of graphite guide members may be a pair of graphite plates.

According to the present invention, it is possible to produce a tantalum carbide material in which favorable flatness is realized, a tantalum carbide distribution is uniform, and cracks are unlikely to occur.

DETAILED DESCRIPTION OF THE INVENTION

Embodiments of the present invention will be described below in detail with reference to the drawings.

Figure 1:
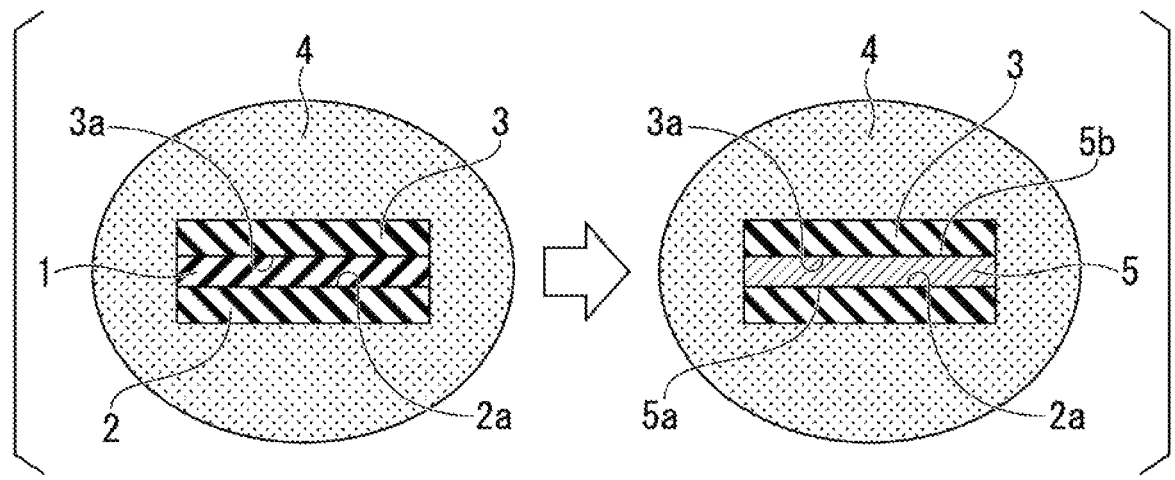
FIG. 1 is a schematic diagram illustrating an example of method of manufacturing a tantalum carbide material according to an embodiment of the present invention.

FIG. 1 is a schematic diagram illustrating an example of a method of manufacturing a tantalum carbide material according to the present embodiment. As shown in FIG. 1, the method of manufacturing a tantalum carbide material (tantalum carbide component) according to the present embodiment includes heating a tantalum material (tantalum component) 1 interposed between a pair of graphite guide members 2 and 3, for example, under an atmosphere of a carbon source-containing gas 4 obtained from argon gas and graphite powder at 1,500° C. or higher for 0.5 hours or longer.

Specifically, first, live tantalum material 1 interposed between the pair of graphite guide members 2 and 3 is prepared. For example, the graphite guide member 2, a tantalum material, and the graphite guide member 3 are superimposed in a flat manner in this order, and a weight is placed thereon from above, and thus the tantalum material 1 can be interposed between the pair of graphite guide members 2 and 3.

The thickness of the tantalum material 1 is 0.1 mm or more and 3.0 mm or less. When the thickness is less than 0.1 mm, it is difficult to maintain uniformity of a film of a tantalum material itself and cracks are likely to occur, and when the thickness exceeds 3.0 mm, it is difficult to carbonize the entire tantalum carbide material 5 in the thickness direction. The tantalum material 1 may be a film-like material or a plate-like material such as a substrate. The tantalum material 1 is composed of tantalum (Ta, TaC, $Ta_2C$) or a tantalum alloy.

The pair of graphite guide members 2 and 3 have main surfaces 2a and 3a, and the main surfaces 2a and 3a are placed on both sides of the tantalum material 1. The shapes of the pair of graphite guide members 2 and 3 are not particularly limited, and for example, a pair of graphite plates may be used. When a pair of graphite plates are placed on both sides of the tantalum material 1, the tantalum material 1 has more favorable flatness. When the pair of graphite guide members 2 and 3 are a pair of graphite plates, the plate thickness of the graphite plate is 1.0 mm or more. In addition, the pair of graphite guide members 2 and 3 are preferably made of isotropic graphite.

When the tantalum material 1 is interposed between the pair of graphite guide members 2 and 3, a pressure applied to the tantalum material 1 is, for example, $1.0 \times 10^2$ N/m² or more and $1.0 \times 10^5$ N/m² or less. When a pressure applied to the tantalum material 1 is less than $1.0 \times 10^2$ N/m², the tantalum material 1 is easily deformed due to carbonization. When the pressure exceeds $1.0 \times 10^5$ N/m², the tantalum material 1 or a tantalum carbide material to be described break easily.

Next, the tantalum material 1 interposed between the pair of graphite guide members 2 and 3 and a hydrocarbon gas source are placed in a container.

The container is preferably made of one or more materials selected from among graphite, tantalum carbide (TaC), niobium carbide (NbC), and tungsten carbide (WC), and is, for example, a graphite crucible. The container includes, for example, a container main body and a lid. When an opening of the container main body is closed or sealed with the lid, its internal space can be made a closed space.

The hydrocarbon gas source preferably contains hydrocarbons. The hydrocarbon gas source is a substance that generates hydrocarbon gases due to heating and additionally generates a carbon source-containing gas.

The hydrocarbons preferably include one or both of aromatic hydrocarbons and aliphatic hydrocarbons. Examples of aromatic hydrocarbons include biphenyl and benzene. Examples of aliphatic hydrocarbons include methane and nonadecane. Hydrocarbons that are adhered to graphite powder may be placed in the container or hydrocarbons that do not adhere to graphite powder may be placed in the container.

The hydrocarbon gas source preferably includes graphite powder. The primary particle size of the graphite powder is not particularly limited, and is, for example, 100 nm or more and 100 μm or less. In addition, the form of graphite powder is not particularly limited, and various forms such as spherical shape, a flake shape, a random shape and a mixture thereof may be used.

Next, argon gas is introduced into the container while the inside of the container is made a closed space, the hydrocarbon gas source is heated to generate the carbon source-containing gas 4, and the tantalum material 1 is heated under an atmosphere of the carbon source-containing gas 4 to obtain the tantalum carbide material 5. In this case, a graphite powder having a particle size of $5 \times 10^{-3}$ g/cm³ or more is preferably used.

Heating conditions of 1,500° C. or higher for 0.5 hours or longer are preferable, for example, 2,000° C. for 1 hour. Examples of a heating method include induction heating and resistance heating. In addition, the pressure in the container during heating is preferably 1 Torr or more and 700 Torr or less. When the pressure in the container is reduced, generation of hydrocarbon gases is promoted. Due to heating, carbon in the pair of graphite guide members 2 and 3 is supplied to a contact part between the tantalum material 1 and the graphite guide members 2 and 3. In addition, at least the hydrocarbons of hydrocarbons and graphite powder constituting the mixture is gasified and the carbon source-containing gas 4 is generated in the closed space of the container. Carbon contained in the carbon source-containing gas 4 is supplied to respective interfaces between the pair of graphite guide members 2 and 3 and the tantalum material 1, and particularly supplied to a poor contact part between the tantalum material 1 and the graphite guide members 2 and 3. As a result, tantalum carbide can be uniformly distributed on one main surface 5a of the tantalum carbide material 5 in the in-plane direction and also tantalum carbide can be uniformly distributed on the other main surface 5b in the in-plane direction. In addition, uneven carbonization is unlikely to occur in the tantalum carbide material 5, and the entire tantalum carbide material 5 can be made to be composed of tantalum carbide.

A process of generating the carbon source-containing gas 4 is preferably performed at the same lime as a process of heating the tantalum material 1, but the process of heating the tantalum material 1 may be performed after the process of generating the carbon source-containing gas 4. In addition, the container in which the carbon source-containing gas 4 is generated is preferably the same container as that in which the tantalum material 1 is heated but it may be a different container. That is, the carbon source-containing gas 4 may be generated in another container, and the carbon source-containing gas 4 may be then introduced into the container in which the tantalum material 1 is heated.

The thickness of the tantalum carbide material 5 obtained by the production method is 0.1 mm or more and 3 mm or less. The carbonization degree (a ratio between tantalum and carbon in tantalum carbide) of the tantalum carbide material 5 is, for example, 1:0.5 to 1. The tantalum carbide material 5 may be a film-like material, but may be a plate-like material such as a substrate. The tantalum carbide material 5 can be used as a constituent member of a SiC single crystal production device, and can be used as, for example, a graphite crucible into which raw materials are filled or a protective layer of a heater. Alternatively, the tantalum carbide material 5 can be used as a coating material for a substrate.

Figure 2:
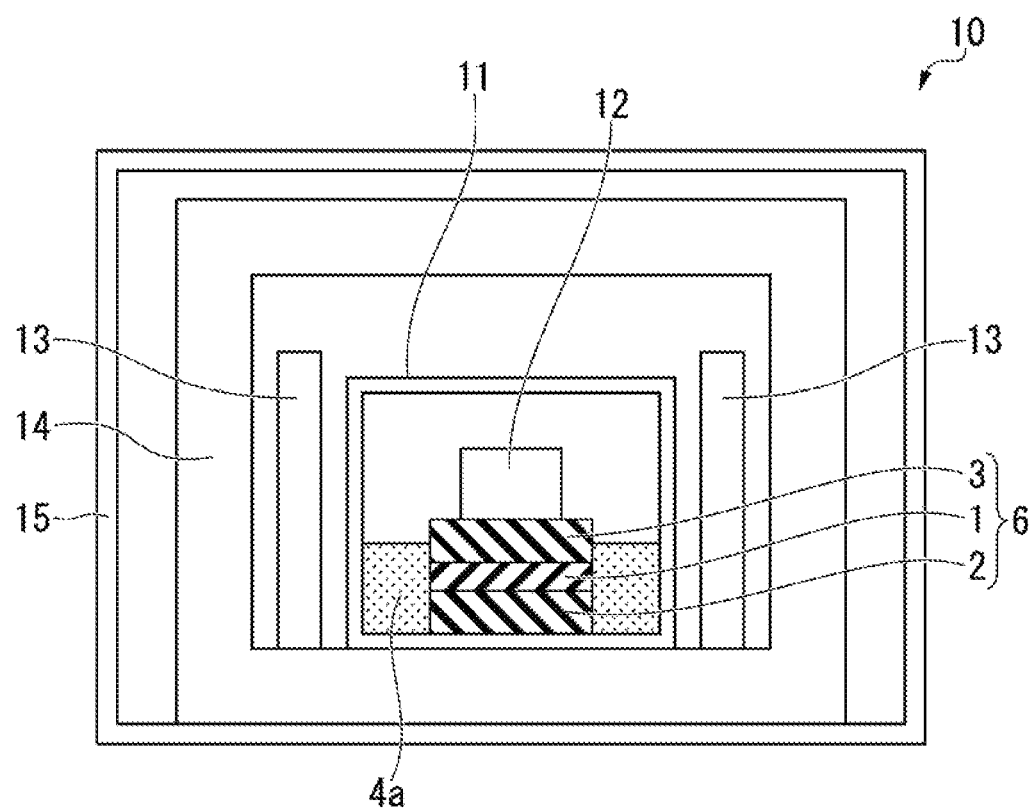
FIG. 2 is a diagram showing an example of a tantalum carbide material production device that implements a method of manufacturing a tantalum carbide material according to the present embodiment.

FIG. 2 is a diagram showing an example of a tantalum carbide material production device that implements a method of manufacturing a tantalum carbide material according to the present embodiment.

In FIG. 2, a tantalum carbide material production device 10 includes, for example, a crucible 11 in which the tantalum material 1 interposed between the pair of graphite guide members 2 and 3 and graphite powder 4a are accommodated, a weight 12 placed on a laminate 6 composed of the pair of graphite guide members 2 and 3 and the tantalum material 1, a heater 13 disposed on the side of the crucible 11, a heat insulating member 14 that covers the crucible 11 and the heater 13 and is externally fitted thereon, and a chamber 15 that is externally fitted to the heat insulating member 14.

The crucible 11 is, for example, a graphite crucible, and the weight 12 is, for example, a graphite lump. In addition, the heater 13 is, for example, a graphite heater, and the heat insulating member 14 is, for example, a carbon thermal insulating material. In the production device 10, an inert gas such as argon gas can be supplied into the crucible 11 from the outside and the internal space of the crucible 11 can be made a closed space.

When a tantalum plate material is heated using such a production device, the tantalum material 1 interposed between the pair of graphite guide members 2 and 3 can be heated under a carbon source-containing gas atmosphere and predetermined temperature conditions.

Figure 3:
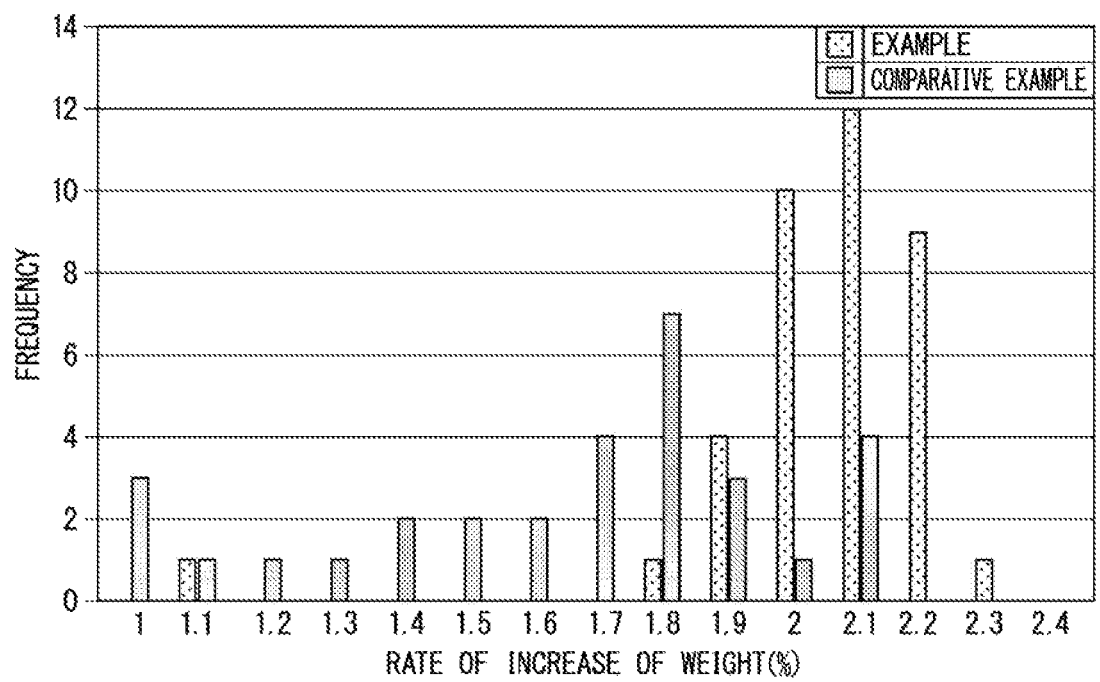
FIG. 3 is a graph show ing an example of variation in the carbonization degree of the tantalum carbide material.

FIG. 3 is a graph show ing an example of variation in the carbonization degree of the tantalum carbide material. As an example, a tantalum plate material having an area of 0.01 m$^2$ interposed between a pair of graphite plates having a thickness of 2 mm is placed in a φ250 mm graphite crucible, and a graphite weight of about 200 g is placed on a laminate composed of the pair of graphite plates and tire tantalum plate material. Next, 100 g of graphite powder is placed in the graphite crucible, and heated at 2,300° C. or lower for about 2 hours using a resistance heating furnace. The pressure in the furnace is set to 100 Torr or more under an argon atmosphere. In addition, in a comparative example, a tantalum plate material is heated under the same conditions as in the example except that 100 g of graphite powder is not placed in the graphite crucible.

Regarding results, as shown in FIG. 3, when the tantalum material is heated while a mixture including hydrocarbons and graphite powder is placed in the container, if the mass of the tantalum carbide material after heating is set as Gc, and the mass of the tantalum material before heating is set as Gt, a rate of increase of weight $\{(Gc-Gt)/Gt \times 100\}$ is mostly within a range of 1.8% to 2.3%. This indicates that the amount of carbon captured by the tantalum material is stable. On the other hand, in the comparative example, when the tantalum material is heated without placing the mixture in the container, a rate of increase of weight is in a wide range of 1% to 2.1%, which indicates a large variation. Therefore, when the tantalum material is heated while a mixture including hydrocarbons and graphite powder is placed in the container, it is inferred that the variation in the rate of increase of weight of the tantalum carbide material tends to be smaller, the influence of a contact slate between the tantalum material and the pair of graphite guide members is small, and carbonization of the tantalum material is performed almost uniformly.

It is not clear whether graphite powder constituting the mixture contributes to carbonization of the tantalum material or reducing uneven carbonization, but it is speculated that, when graphite powder is sublimated, carbon gas generated from graphite powder is used as a carbon source, and directly contributes to carbonization of the tantalum material or reducing uneven carbonization. In addition, it is speculated that, when graphite powder is not sublimated, if graphite powder to which hydrocarbons are adhered undergoes convection in the container, generation of a carbon source-containing gas from hydrocarbons is promoted, thus indirectly contributing to carbonization of the tantalum material or reducing uneven carbonization.

Figure 4:
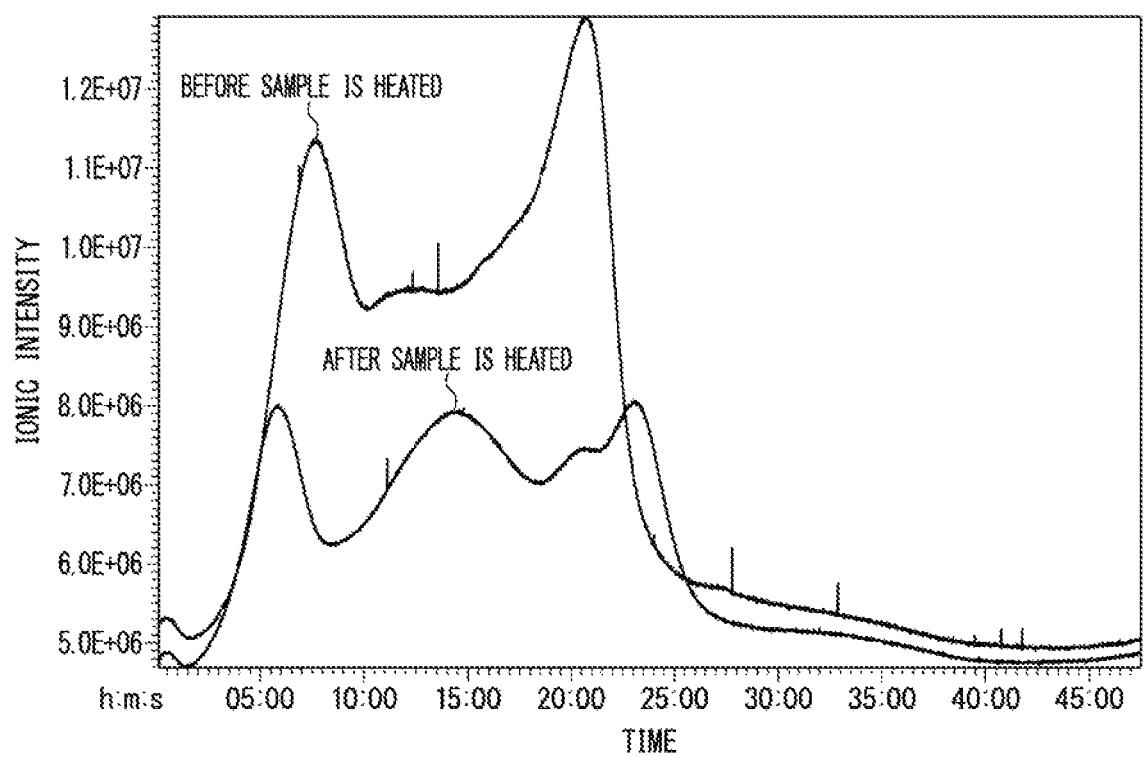
FIG. 4 is a diagram showing an example of a total ion chromatogram (TIC) before and after a mixture including hydrocarbons and graphite powder is heated.

FIG. 4 is a diagram showing an example of a total ion chromatogram (TIC) before and after heating a mixture including hydrocarbons and graphite powder. FIG. 4 shows a case in which 10 mg of graphite powder is heated from 50° C. to 1,000° C. for 45 minutes as an example. For analysis, a Multi-Shot Pyrolyzer (product name "PY-3030D" commercially available from Frontier Laboratories Ltd.) was used.

As shown in FIG. 4, it can be understood that the peak intensity obtained by heating the mixture to 1,000° C., is significantly smaller than the peak intensity before the mixture is heated. Based on this result, it is thought that, when the tantalum material is heated under the above heating conditions, at least hydrocarbons among hydrocarbons and graphite powder constituting the mixture are gasified and separated from the mixture.

Figure 5:
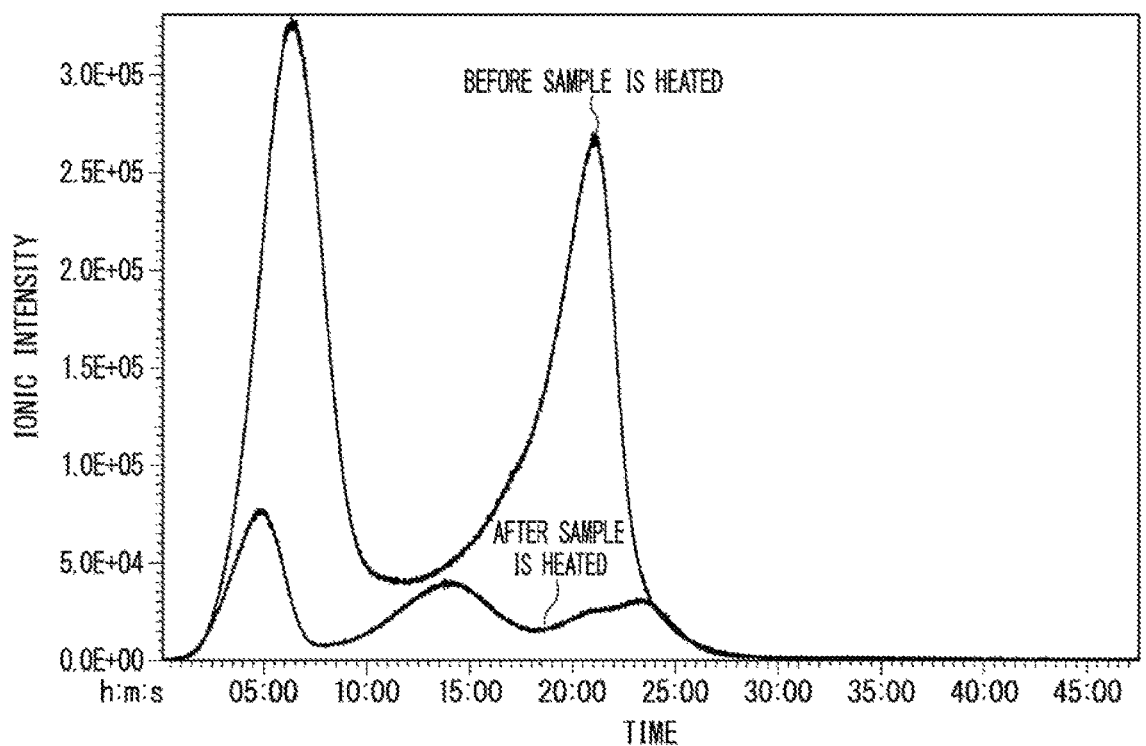
FIG. 5 is a diagram showing a mass chromatogram obtained by extracting the ionic intensity at a mass-to-charge ratio (m/z) of 91 (aromatic hydrocarbons) in the example in FIG. 4.

FIG. 5 is a diagram showing a mass chromatogram obtained by extracting the ionic intensity at a mass-to-charge ratio (m/z) of 91 (aromatic hydrocarbons) in the example in FIG. 4.

As shown in FIG. 5, based on the peak at a mass-to-charge ratio (m/z) of 91, it can be understood that hydrocarbons constituting the mixture include aromatic hydrocarbons, and the ionic intensity after the mixture is heated is significantly smaller than the ionic intensity before the mixture is heated. Based on these results, it is speculated that, when the mixture and the tantalum material are heated under the above treating conditions, among hydrocarbons constituting the mixture, aromatic hydrocarbons are separated from the mixture as a carbon-containing gas. Since a plurality of compounds are included, it is not possible to identify the types of the compounds, but examples of those having high similarity include 2,2',5,5'-tetramethylbiphenyl, and 3,5,3',5'-tetramethylbiphenyl.

Figure 6:
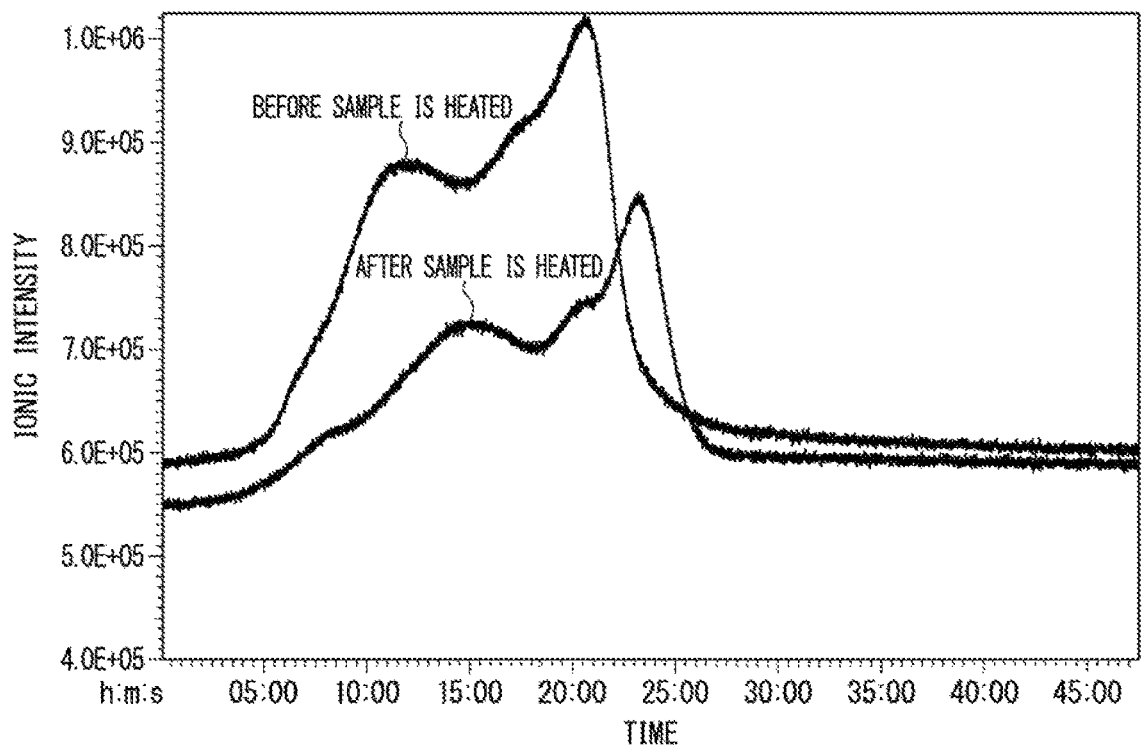
FIG. 6 is a diagram showing a mass chromatogram obtained by extracting the ionic intensity at a mass-to-charge ratio (m/z) of 41 (aliphatic hydrocarbons) in the example in FIG. 4.

FIG. 6 is a diagram showing a mass chromatogram obtained by extracting the ionic intensity at a mass-to-charge ratio (m/z) of 41 (aliphatic hydrocarbons) in the example in FIG. 4.

As shown in FIG. 6, based on the peak at a mass-to-charge ratio (m/z) of 41, it can be understood that hydrocarbons constituting the mixture include aliphatic hydrocarbons, and the ionic intensity after the mixture is heated is significantly smaller than the ionic intensity before the mixture is heated. Based on the results, it can be speculated that aliphatic hydrocarbons are also separated from the mixture as a carbon-containing gas like the aromatic hydrocarbons. Similarly, since a plurality of compounds are included, it is not possible to identify the types of the compound, but examples of those having high similarity include nonadecane and 1-iodo-2-methylundecane.

As described above, according to the present embodiment, since the tantalum material interposed between the pair of graphite guide members is heated under a carbon source-containing gas atmosphere at 1,500° C. or higher for 0.5 hours or longer, carbon is supplied from the pair of graphite guide members and carbon is also supplied from the carbon source-containing gas. Therefore, the tantalum material can be carbonized at both a contact part and a poor contact part between the tantalum material and the graphite guide member, and the tantalum carbide can be uniformly distributed in the in-plane direction of the tantalum carbide material. In addition, since heating is performed with the pair of graphite guide members interposed therebetween, the tantalum material is flattened. Therefore, it is possible to produce a tantalum carbide material in which favorable flatness is realized, a tantalum carbide distribution is uniform, and cracks are unlikely to occur.

While embodiments of the present invention have been described above in detail, the present invention is not limited to the embodiments, and various modifications and alternations can be made in a range within the spirit and scope of the present invention described in the scope of the claims.

EXPLANATION OF REFERENCES

1 Tantalum material
2 Graphite guide member
2a Main surface
3 Graphite guide member
3a Main surface
4 Carbon source-containing gas
4a Graphite powder
5 Tantalum carbide material
5a Main surface
5b Main surface
6 Laminate
11 Crucible
12 Weight
13 Heater
14 Heat insulating member
15 Chamber

What is claimed is:

1. A method of manufacturing a tantalum carbide material in which a tantalum material interposed between a pair of graphite guide members is heated under a carbon source-containing gas atmosphere at 1,500° C. or higher for 0.5 hours or longer to make tantalum carbide from all the tantalum material.

2. The method of manufacturing a tantalum carbide material according to claim 1, comprising
   a process of preparing the tantalum material interposed between the pair of graphite guide members;
   a process of placing the tantalum material interposed between the pair of graphite guide members and a hydrocarbon gas source in a container; and
   a process of, while the inside of the container is made a closed space, heating the hydrocarbon gas source to generate the carbon source-containing gas and heating the tantalum material under an atmosphere of the carbon source-containing gas to obtain a tantalum carbide material.

3. The method of manufacturing a tantalum carbide material according to claim 2,
   wherein the hydrocarbon gas source includes hydrocarbons, and
   wherein the hydrocarbons include one or both of aromatic hydrocarbons and aliphatic hydrocarbons.

4. The method of manufacturing a tantalum carbide material according to claim 1,
   wherein the thickness of the tantalum material is 0.1 mm or more and 3.0 mm or less.

5. The method of manufacturing a tantalum carbide material according to claim 1,
   wherein the pair of graphite guide members are a pair of graphite plates.

6. The method of manufacturing a tantalum carbide material according to claim 1,
   wherein the carbon source-containing gas is generated by heating a hydrocarbon gas source which includes hydrocarbons and graphite powder.

* * * * *